United States Patent
Kitagawa et al.

(10) Patent No.: US 7,923,360 B2
(45) Date of Patent: Apr. 12, 2011

(54) METHOD OF FORMING DIELECTRIC FILMS

(75) Inventors: Hideo Kitagawa, Tottori (JP); Naomu Kitano, Machida (JP)

(73) Assignees: Canon Kabushiki Kaisha, Tokyo (JP); Canon Anelva Corporation, Kanagawa (JP)

( * ) Notice: Subject to any disclaimer, the term of this patent is extended or adjusted under 35 U.S.C. 154(b) by 119 days.

(21) Appl. No.: 12/342,349

(22) Filed: Dec. 23, 2008

(65) Prior Publication Data
US 2009/0170340 A1 Jul. 2, 2009

(30) Foreign Application Priority Data
Dec. 27, 2007 (JP) ................. 2007-336730

(51) Int. Cl.
*H01L 21/425* (2006.01)
(52) U.S. Cl. ........... 438/528; 438/785; 257/E21.248
(58) Field of Classification Search .......... 438/407, 438/423; 257/E21.248
See application file for complete search history.

(56) References Cited

U.S. PATENT DOCUMENTS

| | | | | |
|---|---|---|---|---|
| 6,734,069 B2 | 5/2004 | Eriguchi | | 438/287 |
| 7,144,825 B2 * | 12/2006 | Adetutu et al. | | 438/763 |
| 7,374,635 B2 | 5/2008 | Murakawa et al. | | 156/345.44 |
| 2001/0039098 A1 | 11/2001 | Lu | | |
| 2005/0233526 A1 | 10/2005 | Watanabe et al. | | |

FOREIGN PATENT DOCUMENTS

CN  1194380 C   3/2005
CN  1669153 A   9/2005

OTHER PUBLICATIONS

Chinese Office Action issued in the counterpart Application No. 200810190692.5 dated Dec. 18, 2009 (English language translation included)—9 pages.
U.S. Appl. No. 12/342,360, filed Dec. 23, 2008.
U.S. Appl. No. 12/338,121, filed Dec. 18, 2008.

* cited by examiner

*Primary Examiner* — Chandra Chaudhari
(74) *Attorney, Agent, or Firm* — Fitzpatrick, Cella, Harper & Scinto (57) ABSTRACT

A method of forming dielectric films including a metal silicate on a silicon substrate comprises a first step of oxidizing a surface layer portion of the silicon substrate and forming a silicon dioxide film; a second step of irradiating ion on the surface of the silicon dioxide film and making the surface layer portion of the silicon dioxide film into a reaction-accelerating layer with Si—O cohesion cut; a third step of laminating a metal film on the reaction-accelerating layer in a non-oxidizing atmosphere; and a fourth step of oxidizing the metal film and forming a metal silicate film that diffuses a metal from the metal film to the silicon dioxide film.

9 Claims, 4 Drawing Sheets

METHOD OF FORMING DIELECTRIC FILMS

BACKGROUND OF THE INVENTION

1. Field of the Invention

The present invention relates to a method of forming dielectric films, and in particular, to a method of forming dielectric films including a metal silicate suitable for use as high permittivity constant gate dielectric films in a semiconductor device.

2. Description of the Related Art

In recent years, the thinning of an equivalent oxide thickness (EOT) of gate dielectric films progresses accompanied by the miniaturization of the design rule of a LSI, and for example, according to the International Technology Road Map for Semiconductors (ITRS), it is considered necessary to achieve the EOT of 1 nm or less in 2008. However, when $SiO_2$ or SiON used conventionally as the material of the gate dielectric film of the semiconductor devices are thinned to the level of the above described thickness, the insulation property of the film is rapidly lowered, and a leakage current becomes extremely large. This is because the dielectric films thickness becomes thin to the extent of several molecular layer portions, and direct tunnel current rapidly increases. On the other hand, in the mobile electronic equipments which have become rapidly widespread in recent years, to prolong the battery driving hours, it is requested to reduce the power consumption of the element as much as possible. Hence, the introduction of a high permittivity constant dielectric films (so-called High-K films) such as a metal oxide in place of $SiO_2$ or SiON which has been used conventionally is under review. Since the High-K film has a high permittivity constant, even when its physical film thickness is made thick, it is possible to obtain the EOT equivalent to the $SiO_2$ film, and moreover, it is possible to suppress the leak current to the lower level as the physical film thickness is thick.

As the material of the High-K films, it is said that hafnium nitride silicate (HfSiON) is currently most close to the practical application. As the film-forming method of the HfSiON film, a CVD method using an organic metal material, an atomic layer deposition method (ALD method), a sputtering method, and the like are under review. However, the sputtering method is advantageous in view of the fact that the mixture of carbon impurities is few.

Here, an example of the forming process of the HfSiON film using the sputtering method will be described by using FIGS. 6A to 6E. In FIGS. 6A to 6E, reference numeral 101 denotes a Si substrate, numeral 102 a $SiO_2$ (silicon dioxide) film, numeral 105 a metal Hf film, numeral 107 HfSiO (Hf-silicate) film, and numeral 108 HfSiON film. First, on a cleaned Si substrate 101, a thin $SiO_2$ film 102 is formed by thermal oxidation method, and upon thereof, a Hf atom is laminated by the sputtering method, and a metal Hf film 105 is formed. Next, radical oxidation by using the thermal oxidation or the oxygen plasma, and the like is performed. Thereby, the metal Hf film 105 is oxidized to introduce oxygen, and at the same time, a Hf atom in the metal Hf film 105 is dispersed into the $SiO_2$ film 102, and moreover, a Si atom in the $SiO_2$ film 102 is dispersed in the metal Hf film 105. Thus, the metal silicate film, that is, the HfSiO film 107 is formed. Thereby, the film thickness of the $SiO_2$ film 102 of a low dielectric constant is reduced. After that, by performing radical nitriding using nitrogen plasma and the like, the HfSiO film 107 is nitrided to introduce nitrogen, thereby to form the HfSiON film 108. Because the relative permittivity constant of the HfSiON film 108 is high, and the film thickness of the $SiO_2$ film 102 is reduced, a small dielectric film of the EOT including the HfSiON film 108 and the $SiO_2$ film 102 is formed.

Now, the above described method involves a problem that a control of the diffusion of Hf is difficult, and that the formation of the dielectric films having a required film thickness with excellent productivity is difficult. That is, as disclosed in Japanese Patent Application Laid-Open No. 2002-314074 (US counterpart U.S. Pat. No. 6,734,069, US Patent Application Publication 2003/0092238), to expedite the diffusion, when the thermal oxidation is performed at high temperatures, a Si substrate of the ground is oxidized, and the thickness of the $SiO_2$ film is sharply increased, and this makes it difficult to reduce the EOT. Further, even when a RTA (Rapid Thermal Annealing) and a flush lamp annealing are employed, the control of the diffusion is not easy. While the oxidation under high vacuum atmosphere makes it possible to disperse the film thickness while controlling the same, it takes a long time in the treatment, and causes a problem of the throughput being low. On the contrary, when the radical oxidation is performed at low temperature, since the diffusion is extremely sluggish, in the case where the oxidation treatment is performed for a short period, even after the oxidation, a thick $SiO_2$ film remains, and this makes it difficult to form a small film of the EOT. Further, because the diffusion of the Hf is little, the finished film does not become a HfSiON film, but becomes a HfON film having a low heat resistance, so that crystallization occurs at an annealing treatment of the later process, thereby causing a problem of the leakage current being increased. Further, if the oxidation time is prolonged, though the diffusion progresses, the oxygen atom reaches up to the Si substrate earlier, and this causes a problem of the $SiO_2$ film thickness becoming thick.

Meantime, Japanese Patent No. 3746968 (US counterpart U.S. Pat. No. 7,166,185, U.S. Pat. No. 7,374,635) discloses a method in which a silicon dioxide film is formed on the surface of a silicon substrate, and on the surface of this silicon dioxide film, a silicon nitride film is formed, and on the surface of this silicon nitride film, the high permittivity constant dielectric films are formed. Here, at the time of forming the silicon nitride film, the silicon dioxide film is exposed to nitride plasma. However, this nitride plasma exposure forms a silicon nitride film remained as the dielectric films by nitriding the surface of the silicon dioxide film, and this silicon nitride film isolates the silicon dioxide film and the high permittivity constant dielectric films.

As described above, in the film-formation of the High-K film, there is a problem that a control of the diffusion of Hf is difficult, and the formation of the dielectric films having a required film thickness with excellent productivity is difficult.

SUMMARY OF THE INVENTION

In view of the above described technical problems, an object of the present invention is to provide a method of forming dielectric films capable of forming the dielectric films which is easy to control the diffusion of a metal such as Hf and the like and has a required film thickness with excellent productivity.

The present invention is directed to a method of forming a dielectric film including a metal silicate on a silicon substrate, comprising:

a first step of oxidizing a surface of the silicon substrate for forming a silicon oxide film;

a second step of irradiating ion on the surface of the silicon oxide film for making the surface of the silicon oxide film into a reaction-accelerating layer with Si—O cohesion cut;

a third step of laminating a metal film on the reaction-accelerating layer in a non-oxidizing atmosphere; and a fourth step of oxidizing the metal film for forming a metal silicate film that diffuses a metal from the metal film to the silicon oxide film.

The method of forming a dielectric film can further comprise a fifth step of nitriding the metal silicate film after the fourth step.

The nitriding of the fifth step can be executed by radical nitriding.

The incident energy of the ion can be 2 eV or more and 20 eV or less.

The ion can be a rare gas ion or nitrogen ion or oxygen ion and ion of oxide or nitride.

The third step can be executed by sputtering.

The reaction-accelerating layer can be made into the metal silicate film by the third step.

The oxidation of the fourth step can be executed by radical oxidation.

The present invention comprises the second step, in which ion is irradiated on the surface of the silicon dioxide film between the first step and the third step and the surface layer portion of the silicon dioxide film is the reaction-accelerating layer with Si—O cohesion cut. Thereby, a control of the diffusion of the metal becomes easy, and the dielectric films having a required film thickness can be formed with excellent productivity.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

FIGS. 1A to 1F are step sectional views for describing a first embodiment of the present invention. Here, reference numeral 101 denotes a Si substrate which is a silicon substrate, numeral 102 a $SiO_2$ film which is a silicon oxide film, numeral 103 an irradiated ion, numeral 104 a reaction-accelerating layer formed by ion irradiation, and numeral 105 a metal Hf film which is a metal film, respectively. Further, numeral 106 denotes a HfSiOx film which is a metal silicate film, numeral 107 a HfSiO film which is a metal silicate film, and numeral 108 a HfSiON film which is a nitride metal silicate film, respectively.

The dielectric film is formed by the HfSiON film 108 and the residual silicon dioxide film between the HfSiON film 108 and the Si substrate 101. Here, by the existence of the residual silicon oxide film, an interfacial property is improved, and an electrical insulating property of the dielectric films is enhanced. However, since the residual silicon oxide film is lower in relative dielectric constant than the nitride metal silicate film 104, the thickness of the residual silicon dioxide film is preferably made thinner than the thickness of the nitride metal silicate film 104. For example, the thickness of the nitride metal silicate film 104 is 1.0 to 2.0 nm, and thickness of the residual silicon dioxide film 105 is 0.5 to 1.0 nm.

The silicon substrate 101, for example, can use one or the like which is made of a single crystal silicon having a (100) face orientation, and further, doped with phosphor with a resistance value controlled in the range of 0.1 Ω·cm to 10 Ω·cm. In the present invention, the silicon substrate 101 is not limited to the example described as above, but if a silicon atom is exposed on the surface laminated with the film, the silicon substrate may have the face orientation, the dopant, and the resistance value different from the above. Further, for example, silicon may be grown on the substrate made of the material other than silicon by an epitaxial method.

First, on the cleaned Si substrate 101, a thin $SiO_2$ film 102 is formed by a thermal oxidizing method. The silicon dioxide film formed at this stage, that is, the $SiO_2$ film 102 is referred to as an initial silicon dioxide film (initial oxide film), that is, as an initial $SiO_2$ film. The thickness of the $SiO_2$ film 102, for example, is 1.0 to 2.0 nm. Next, the surface of the $SiO_2$ film 102 is irradiated with an ion 103, and by this irradiation, the surface layer portion of the $SiO_2$ film 102 is generated with a cohesion defect. The surface portion which is a part of this $SiO_2$ film 102 is referred to as a reaction-accelerating layer 104. The incident energy of the ion 103 is sufficient enough to cause the cohesion defect by cutting the Si—O cohesion inside the surface layer portion of the $SiO_2$ film 102, and moreover, the reaction-accelerating layer 104 is selected so as not to reach up to the Si substrate 101. Such incident energy of the ion 103, for example, is 2 eV or more and 20 eV or less. Next, on the reaction-accelerating layer 104 introduced with the cohesion defect, the metal Hf film 105 is laminated by the sputtering method in the non-oxidizing atmosphere. At the time of laminating the metal Hf film 105, in the portion of the reaction-accelerating layer 104 of the $SiO_2$ film 102, even when the substrate temperature is not made high, the Hf atom and $SiO_2$ are easily mixed, and the HfSiOx film 106 having few oxygen content is formed. Here, x is 0<x<2. Next, for the metal Hf film 105 and the HfSiOx film 106, radical oxidization using oxide plasma and the like is performed as oxidization treatment, thereby to form the HfSiO film 107 which is close to a chemically logical composition ratio. By using this radical oxidization, the metal Hf film 105 and the HfSiOx film 106 can be oxidized at low temperatures.

In the present invention, the 'non-oxidizing atmosphere' means an atmosphere in which the Si substrate 101 is not oxidized. The non-oxidizing atmosphere is preferably made of at least one from He, Ne, Ar, Kr, and Xe which are rare gases. Further, the oxygen partial pressure of the non-oxidizing atmosphere is preferably $1 \times 10^{-5}$ Pa or less.

After the above described step, the HfSiO film 107 is subjected to the radical nitriding by using the nitride plasma and the like as the nitriding treatment, thereby to form the HfSiON film 108 and use the HfSiON film 108 as the dielectric film. By using this radical nitriding, the HfSiO film 107 can be nitrided at the low temperature.

In the present embodiment, the HfSiO film 107 subjected to the oxidization treatment only can be also used as the dielectric film. In this case, the final nitriding treatment may not be performed.

In the process of oxidizing the metal Hf film, the Hf atom is further diffused into the $SiO_2$ film 102 below the reaction-accelerating layer 104, and the portion of the $SiO_2$ film 102 of the low permittivity constant finally remained, that is, the thickness of residual $SiO_2$ film is made thin to a large degree as compared with the case where the ion irradiation is not performed. The thickness of the residual $SiO_2$ film can be set, for example, to 0.5 to 1.0 nm. As a result, not only the relative permittivity constant of the HfSiON film 108 is low, but also the dielectric films having thinner EOT can be formed.

The ion irradiation method of forming the reaction-accelerating layer 104 is as follows. The ion irradiation at the low incident energy such as 20 eV or less is difficult in an ordinary ion implantation apparatus. Hence, the most simplest and highly reliable method is to insert the Si substrate 101 attached with the $SiO_2$ film 102 into the plasma controlled in electronic temperature and use the ion accelerated by a sheath voltage between the substrate and the plasma. The electronic temperature can be controlled by the plasma generation method and external parameters such as the inputted high frequency power and the treatment pressure.

Figure 1A:
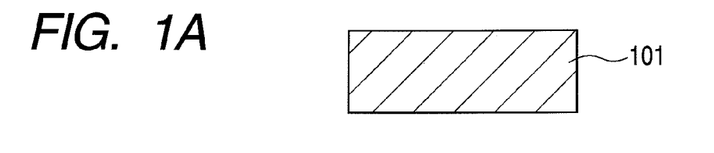
FIGS. 1A, 1B, 1C, 1D, 1E and 1F are step sectional views for describing a first embodiment of the present invention.
Figure 1B:
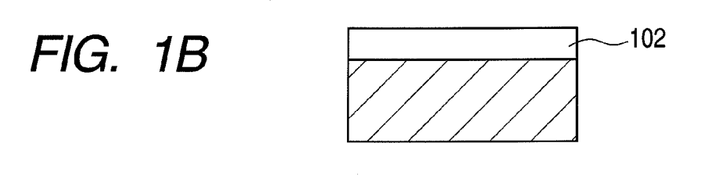
Figure 1C:
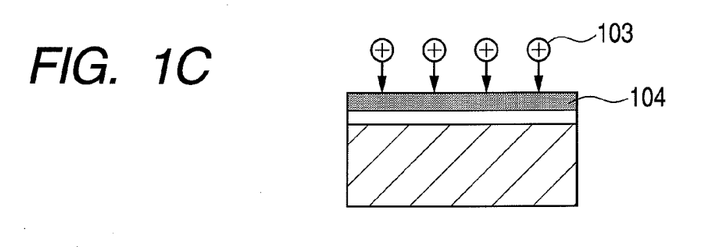
Figure 1D:
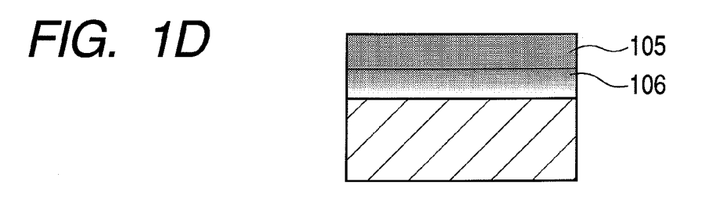
Figure 1E:
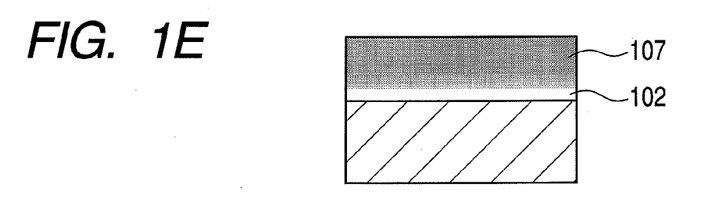
Figure 1F:
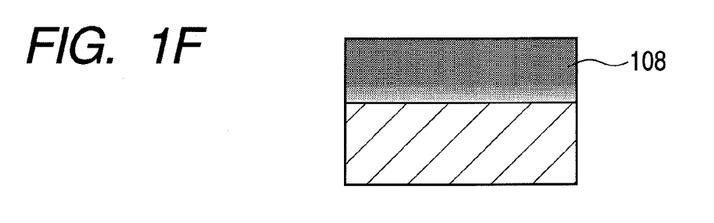
Figure 2:
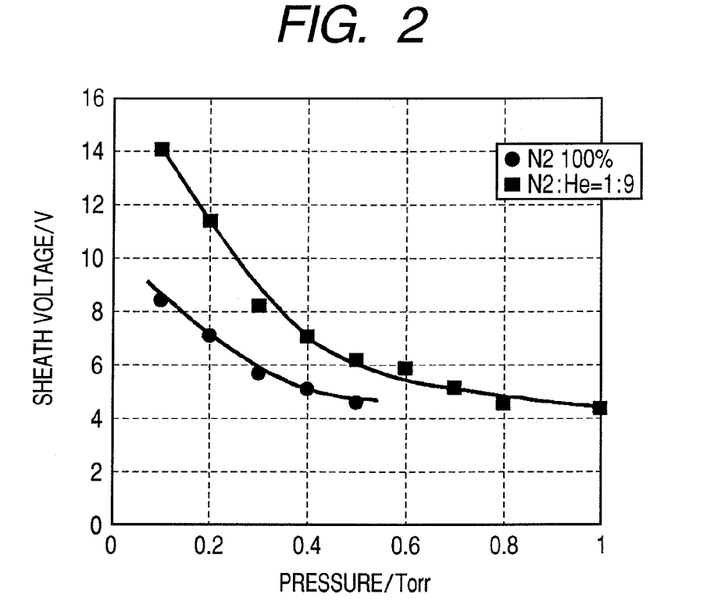
FIG. 2 is a view showing an example of the change of a sheath voltage by the change of a pressure and a gas composition at an ion irradiating process.

In FIG. 2 is shown an example of pressure dependability of the sheath voltage in the case of using surface wave interference plasma. In the electric discharge of 100% by $N_2$, the pressure is changed between 0.1 Torr and 0.5 Torr, whereby it is possible to control the sheath voltages of 5 to 9V. Further, in the electronic discharge added with He by 90%, the pressure is changed between 0.1 Torr and 1.0 Torr, whereby it is possible to control the sheath voltages of 5 to 14V. Even in the $N_2$ plasma added He by 90%, ionic species are mixed with $N^+$ and $N_2^+$, and it is confirmed that $He^+$ ion hardly exists. In an apparatus used for obtaining the data of FIG. 2, while the sheath voltage can be controlled only up to 14V, by changing the plasma generation method and the like, it is possible to easily reach the sheath voltage such as 20V.

Next, the ion species and the incident energy suitable to form the reaction-accelerating layer 104 will be described. First, in view of not implanting impurity element into the film, the ion species are limited only to molecular ions of rare gas (He, Ne, Ar, Kr, and Xe) ion, and nitrogen, oxygen and the compound thereof. As the molecular ions of nitrogen, oxygen and the compound thereof, $N^+$, $N_2^+$, $O^+$, $O_2^+$, $NO^+$, $N_2O^+$, and $NO_2^+$ are illustrated. Since Si and metal, for example, Hf and the like are film-constituting elements, there is a possibility. However, these elements are not easy to form plasma by a simple substance or oxide/nitride, and it is not practical. Further, when the ion of Si or Hf is made to be incident, not only the reaction-accelerating layer is formed, but also the lamination of the film occurs. As a result, a physical film thickness increases, and it is liable to be difficult to achieve the initial object of forming the film having a thinner EOT.

Figure 3:
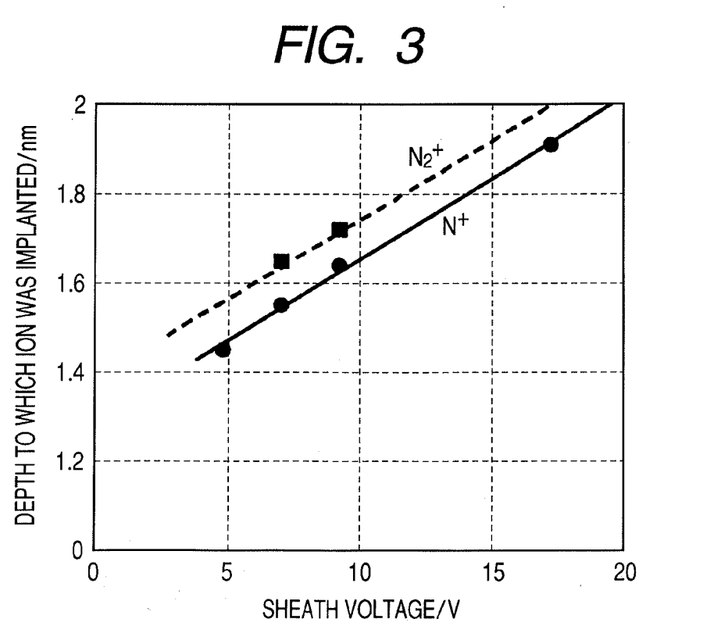
FIG. 3 is a view showing a measurement result of the sheath voltage dependability of an ion implantation depth at the ion irradiating process.

In FIG. 3 is shown a relationship between the sheath voltage and the ion implanting depth. The figure shows the result in which, by inserting the Si substrate 101 attached with the $SiO_2$ film 102 into the $N_2$ plasma, the ions of $N^+$ and $N_2^+$ are implanted into the $SiO_2$ film 102. The implanting depth is taken and defined as a depth which becomes 1/10 of the peak concentration obtained by measuring by using a SIMS (Secondary Ion Mass Spectrometry). From FIG. 3, it is known that as the sheath voltage increases, the implanting depth increases, and in the case of $N^+$, with the sheath voltage approximately 20 V, the implanting depth reaches 2 nm. Further, the result is shown in which $N_2^+$ ion rather than $N^+$ becomes deeper in implanting depth.

Figure 4:
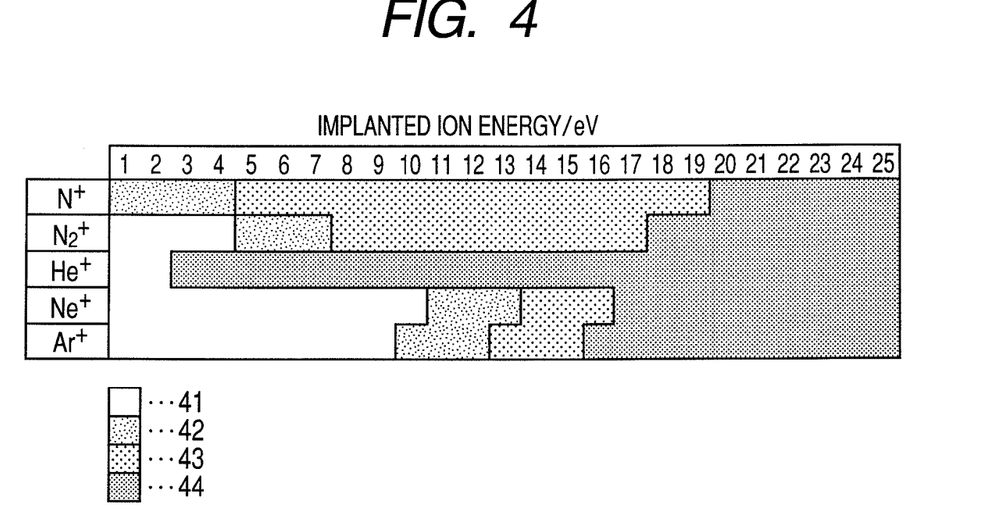
FIG. 4 is a view showing an incident ion energy dependability of the reaction aspects with various ions and the $SiO_2$ films used in the ion irradiating process.

In FIG. 4 is shown a result in which the reactions generated by each incident ion energy are sorted out relative to various ion species. This result is the forecast of reaction modes by using molecular dynamics simulation by the semiempirical molecular orbital method and ion implantation simulation by the Monte Carlo method in addition to the experimental result shown in FIG. 3. In FIG. 4, as ion species, $N^+$, $N_2^+$, $He^+$, $Ne^+$, and $Ar^+$ are shown. The figure shows each state, respectively, in which numeral 41 denotes bounce back of the incident ion, numeral 42 cohesion cutting, numeral 43 spring-out of an oxygen element, numeral 44 an arrival at the substrate of the implanted particles when film thickness is 2 nm.

First, since $N^+$ is extremely high in reactivity, even in the low energy such as 1 eV, a reaction occurs by which it is inserted by cutting the Si—O cohesion. Further, the spring-out of the O atom occurs by the low energy such as 5 eV. On the other hand, since $N^+$ is high in reactivity and the implanted ion is liable to remain in the vicinity of the surface, the energy whose implanting depth reaches 2 nm is the highest from among the illustrated ion specifies.

Next, since $N_2^+$ is low in reactivity as compared with $N^+$, the threshold energy in which the reactions such as the cutting of the Si—O cohesion and the bounce back of the O atom occur becomes higher in value than $N^+$.

In the case of $N_2^+$, though it is small, it has some reactivity, but in the case of the rare gas, it has no reactivity. Hence, the threshold value of the cohesion cutting and the spring-out in the case of the rare gas becomes further higher than that of $N_2^+$. On the other hand, the reaching depth of the ion is the shallowest in the case of the ion having a mass close to a Si atom and an O atom that forms the $SiO_2$ film 102 which is an irradiated object and the ion heavier or lighter than that is deep in the implanting depth. Therefore, the implanting depth of $Ne^+$ is the shallowest and the depth becomes deeper in order of Ne<Ar<Kr. Further, since $He^+$ is light in mass, and the size of ion is small, its implanting depth becomes extremely deep.

By using FIG. 4 in which these results are sorted out, adequacy of the formation of the reaction-accelerating layer 104 relative to the ion species and the energy is shown as follows.

First, $N^+$ and $N_2^+$ are wide and preferred in the allowable range of the incident energy, that is, in the range of the incident energy in which the cutting of Si—O cohesion and spring-out of the O atom are generated. While one which is the widest in the incident energy allowable width is $N^+$, in the case of $N^+$, there is the need of paying attention to the fact that reactivity is high and nitrogen is liable to remain in the $SiO_2$ film 102. On the other hand, in the case of $N_2^+$, though it is slightly shallower than $N^+$ in the energy allowable width, $N_2^+$ after cutting the Si—O cohesion is liable to be eliminated to a vapor phase as a $N_2$ molecular, and therefore, when it is desired to suppress a nitrogen amount in the $SiO_2$ film 102, it is better to use $N^+$.

In FIG. 4, no mention is made of $O^+$ and $O_2^+$. This is because oxygen plasma irradiation for generating these ions is considered not preferable, and the reason is as follows. When oxygen plasma is generated for the purpose of oxygen ion irradiation, a large number of oxygen radicals far greater than ion are generated. These oxygen radicals are easily diffused into the $SiO_2$ film 102 to reach up to the Si substrate 101 and oxidize its surface layer portion, thereby increasing f the $SiO_2$ film thickness. As a result, before the reaction-accelerating layer 104 is formed, the $SiO_2$ film thickness increases to the extent of a large degree. An increasing amount of the thickness of the SiO$_2$ film depends on the thickness of the initial SiO$_2$ film 102, and rapidly increases in the case where this initial dioxide film thickness is 2 nm or less. Hence, the actual usage in the case where the initial dioxide film thickness is often 2 nm or less is not preferable.

Although the results of NO$^+$, N$_2$O$^+$, and NO$_2^+$ are also not mentioned in FIG. 4, these ions are preferred differently from oxide ions. The reason is because these ions are generated by plasma of O$_2$/N$_2$ mixed gas, and a generating amount of the active oxide radical is few. Since NO$^+$, N$_2$O$^+$, and NO$_2^+$ are also large in molecular size, it is expected that the effect close to N$_2^+$ is obtained.

The rare gas ion, as compared with N$^+$ and N$_2^+$, is narrow in energy allowable range. Particularly, in the case of He$^+$, since the implanting depth is deep, the introduction of the reaction-accelerating layer into the surface portion only of the SiO$_2$ film 102 is more difficult than the case of Ne$^+$ and Ar$^+$. On the other hand, in the case of Ne$^+$ and Ar$^+$, it is possible to form a preferable reaction-accelerating layer 104 by using the incident energy of approximately 10 to 15 eV. Although not shown in FIG. 4, even Kr$^+$ and Xe$^+$ can obtain the same effect.

Figure 5:
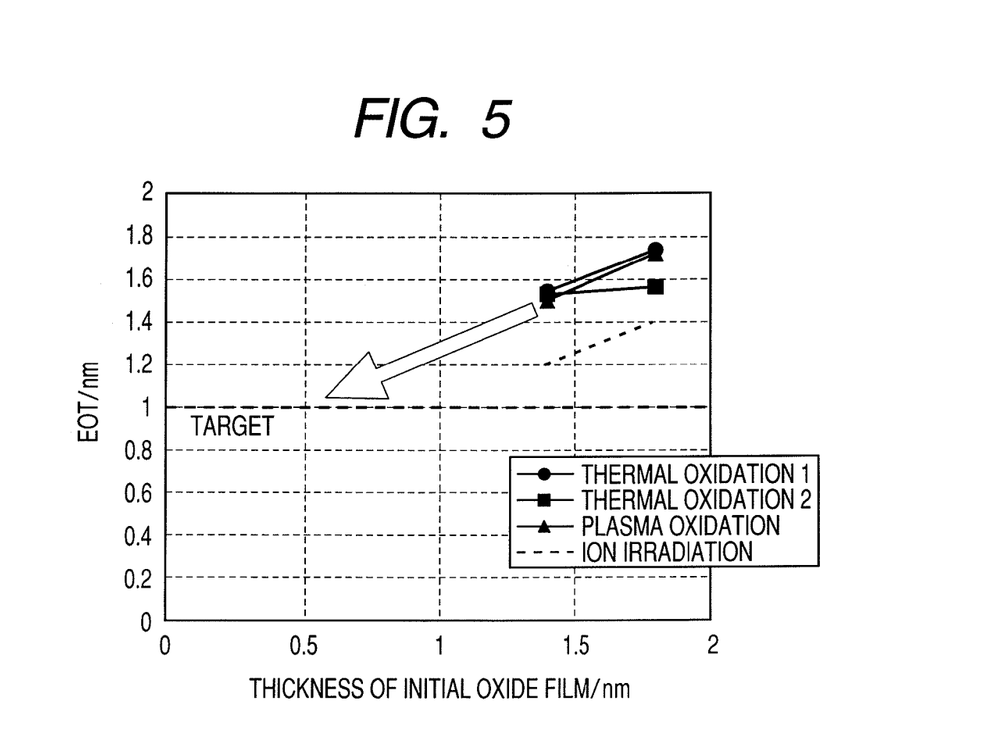
FIG. 5 is a view showing the relationship between an initial oxide film thickness and an EOT of the dielectric films in the present invention and the conventional example.
Figure 6A:
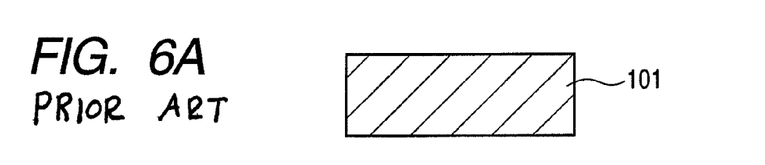
FIGS. 6A, 6B, 6C, 6D and 6E are step sectional views showing an example of the formation process of the HfSiON film using the conventional sputtering method.
Figure 6B:
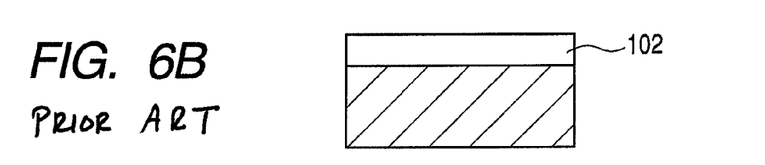
Figure 6C:
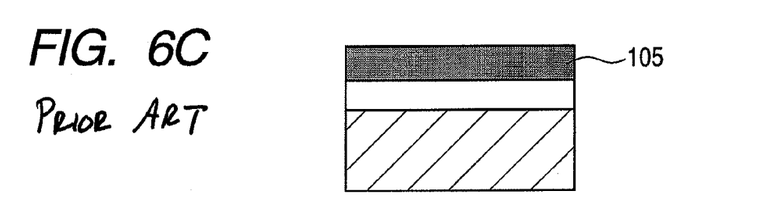
Figure 6D:
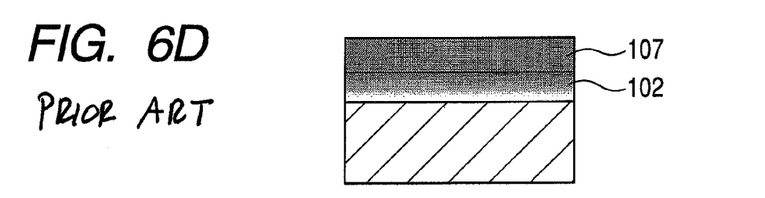
Figure 6E:
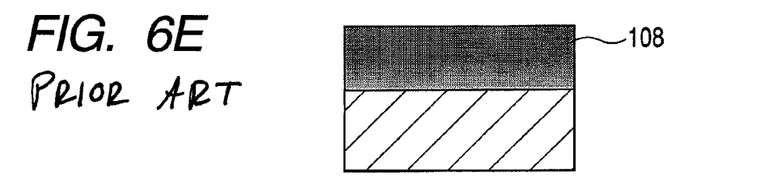

In FIG. 5, when the initial SiO$_2$ film is formed by the thermal treatment (thermal oxidations 1 and 2) or the plasma oxidation by following the processes of FIGS. 1A to 1F without performing the ion irradiation until performing the formation of the HfSiON film, the dependability on the initial dioxide film thickness of the obtained EOT is shown by the solid line. Although slightly different depending on the conditions, when an attempt is made at achieving EOT=1 nm which is the target by making the initial dioxide film thickness thin, it is presumed that approximately 0.5 nm of the initial oxide film thickness is required. However, at present, by this film thickness, it is not easy to obtain the SiO$_2$ film of such high quality.

To study into the cause that the EOT is not reduced as expected in this way, a cross-section observation of the HfSiON film is performed by using the TEM, and the thickness of the HfSiON film and the SiO$_2$ film is measured. As a result, the reduced amount of the SiO$_2$ film thickness is approximately 0.6 nm in the case of the thermal oxidation, and is approximately 0.3 nm in the case of the plasma oxidation. From these results, it is known that the diffusion of Hf into SiO$_2$ is smaller than expected, and below the HfSiON film, a thick SiO$_2$ film remains, and this is a cause of increasing the EOT. However, despite of the change of the conditions toward further strengthening the oxidation, the remarkable reduction of the EOT is not confirmed. This shows that the oxygen atom diffuses up to the Si substrate and the reaction to oxidize the Si substrate is quicker than the diffusion of Hf.

On the other hand, when the ion irradiation is performed by following the steps of FIGS. 1A to 1F until performing the formation of the HfSiON film 108, dependability on the initial dioxide film thickness of the obtained EOT is shown by a broken line. According to the present invention, a film thickness reduced amount of the SiO$_2$ film is enabled to be increased to 1 nm or more. As a result, as shown in FIG. 5 by a broken line, even when a relatively thick initial dioxide film is used, it is possible to obtain a film having a sufficiently small EOT. Further, EOT=1 nm can be achieved by the initial dioxide film thickness of approximately 1 nm.

As described earlier, the ion implanting depth shown in FIG. 3 shows a depth in which the concentration of the implanted atom becomes 1/10 of the peak. It is presumed that the introduction of a large amount of crystal defects at a level of speeding up the metal diffusion is up to the depth of approximately one half of the peak concentration, and that depth is a depth of approximately 60% of the depth in which the concentration becomes 1/10. Hence, in the condition in which the sheath voltage is the lowest, a mixing depth (depth in which a large number of crystal defects are introduced) becomes around 0.9 nm. Further, by the oxidizing treatment such as the thermal oxidation, the thickness of the SiO$_2$ film is further reduced to approximately 0.3 nm. As a result, when the initial dioxide film thickness is approximately 1 nm, EOT=1 nm can be achieved.

EXAMPLES

While the forming method of the dielectric film according to the present invention will be more specifically described below by citing examples, it is to be understood that the present invention is not limited to these examples.

Example 1

As a first example of the present invention, an example will be shown, in which the surface of the SiO$_2$ film 102 of 1.8 nm in initial film thickness is irradiated with the nitride plasma by an ion irradiation process, thereby making the surface layer portion of the SiO$_2$ film 102 into the reaction-accelerating layer 104. In the present example, in the ion irradiation process, the surface wave interference plasma treatment apparatus which is the apparatus having obtained the data of FIG. 2 was used.

First, as a first step, the Si substrate 101 was cleaned to remove a native oxide film, and after that, oxidized the surface portion of the Si substrate 101 by using a RTA (Rapid Thermal Annealing) apparatus, thereby to form the SiO$_2$ film 102 of 1.8 nm in thickness.

Next, the Si substrate 101 attached with the SiO$_2$ film 102 was introduced into a plasma treatment chamber, and was disposed on a substrate support stage set at the temperature of 100° C. A vacuum container was introduced with a N$_2$ gas of 500 sccm, and the pressure was adjusted to 60 Pa, and a high frequency power of 3000 W was applied, thereby generating the nitride plasma made of N$^+$ and N$_2$. The surface of the SiO$_2$ film 102 was exposed to this nitride plasma continuously for 30 seconds, whereby the ion irradiation process at the incident energy of 10 eV was performed. Thereby, the surface layer portion (0.7 nm in thickness) of the SiO$_2$ film 102 was made into the reaction-accelerating layer 104.

Next, as a second step, while holding the Si substrate 101 attached with the SiO$_2$ film 102 in vacuum, it was moved to a metal Hf deposition chamber, and the metal Hf film 105 was laminated to the thickness of 0.8 nm in the non-oxidizing atmosphere by the sputtering method. Thereby, the metal Hf was diffused into the reaction-accelerating layer 104 to form the HfSiO$_x$ film 106. An oxide partial pressure during the forming process of the metal Hf film 105 was 1×10$^{-7}$ to 10$^{-8}$ Pa.

Next, as a third step, while holding the Si substrate 101 attached with films 105, 106, and 102 in vacuum, it was moved to a plasma oxidation treatment chamber, and was disposed on the substrate support stage set to the temperature of 300° C. The vacuum container was introduced with an O$_2$ gas of 1000 sccm, and the pressure was adjusted to 100 Pa, and the high frequency power of 3000 W was applied, thereby generating the oxide plasma. The metal Hf film 105 was exposed to this oxide plasma continuously for 5 seconds. By the radical oxidation as a result thereof, the films 105 and 106 were transformed into the HfSiO film 107.

Next, as a fourth step, the Si substrate 101 attached with the films 107 and 102 was introduced into a plasma nitride treatment chamber, and was disposed on the substrate support stage set at the temperature of 300° C. A vacuum container was introduced with a $N_2$ gas of 200 sccm, and the pressure was adjusted to 25 Pa, and a high frequency power of 3000 W was applied, thereby generating the nitride plasma. The HfSiO film 107 was exposed to this nitride plasma continuously for 30 seconds. By the radical nitriding as a result thereof, the HfSiO film 107 was transformed into the HfSiON film 108.

After that, annealing was performed for five seconds at 1000° C., and a gate electrode was formed to fabricate a sample of the present invention, and its MOS capacitor characteristic was measured.

For comparison, a comparison sample was similarly fabricated except that the ion irradiation process was not performed, and its MOS capacitor characteristic was measured.

As a result, the value of the EOT was approximately 1.4 nm in the sample of the present invention obtained by performing the ion irradiation process, whereas it was approximately 1.7 nm in the comparison sample having not performed the ion irradiation process. As described above, by performing the nitride plasma irradiation before forming the metal Hf film by the sputtering, the EOT was reduced by approximately 0.3 nm, and the effectivity of the present invention was confirmed.

Example 2

As a second example of the present invention, an example will be shown, in which the surface of the $SiO_2$ film 102 of 1.4 nm in initial film thickness is irradiated with the nitride plasma by an ion irradiation process, thereby making the surface layer portion of the $SiO_2$ film 102 into the reaction-accelerating layer 104. In the present example, in the ion irradiation process, the surface wave interference plasma treatment apparatus which is the apparatus having obtained the data of FIG. 2 was used.

First, as a first step, the Si substrate 101 was cleaned to remove a native oxide film, and after that, oxidized the surface portion of the Si substrate 101 by using a RTA (Rapid Thermal Annealing) apparatus, thereby to form the $SiO_2$ film 102 of 1.4 nm in thickness.

Next, the Si substrate 101 attached with the $SiO_2$ film 102 was introduced into a plasma treatment chamber, and was disposed on a substrate support stage set at the temperature of 100° C. A vacuum container was introduced with a $N_2$ gas of 200 sccm, and the pressure was adjusted to 25 Pa, and a high frequency power of 3000 W was applied, thereby generating the nitride plasma made of $N^+$ and $N_2^+$. The surface of the $SiO_2$ film 102 was exposed to this nitride plasma continuously for 5 seconds, whereby the ion irradiation process at the incident energy of 10 eV was performed. Thereby, the surface layer portion (0.5 nm in thickness) of the $SiO_2$ film 102 was made into the reaction-accelerating layer 104.

Next, as a second step, while holding the Si substrate 101 attached with the $SiO_2$ film 102 in vacuum, it was moved to the metal Hf deposition chamber, and the metal Hf film 105 was laminated to the thickness of 0.5 nm in the non-oxidizing atmosphere by the sputtering method. Thereby, the metal Hf was diffused into the reaction-accelerating layer 104 to form the HfSiOx film 106. An oxide partial pressure during the forming process of the metal Hf film 105 was $1\times10^{-7}$ to $10^{-8}$ Pa.

Next, the processes subsequent to the third step were performed similarly to the example 1, thereby to fabricate the sample of the present invention, and its MOS capacitor characteristic was measured.

For comparison, a comparison sample was similarly fabricated except that the ion irradiation was not performed, and its MOS capacitor characteristic was measured.

As a result, the value of the EOT was approximately 1.2 nm in the sample of the present invention obtained by performing the iron irradiation process, whereas it was approximately 1.5 nm in the comparison sample having not performed the ion irradiation process. As described above, by performing the nitride plasma irradiation before forming the metal Hf film by the sputtering, the EOT was reduced by approximately 0.3 nm, and even in the case of the $SiO_2$ film 102 of 1.4 nm in initial film thickness, the effectivity of the present invention was confirmed.

Example 3

As a third example of the present invention, an example will be shown, in which the surface of the $SiO_2$ film 102 of 1.8 nm in initial film thickness is irradiated with the Ne plasma by an ion irradiation process, thereby making the surface layer portion of the $SiO_2$ film 102 into the reaction-accelerating layer 104. In the present example, in the ion irradiation process, the surface wave interference plasma treatment apparatus which is the apparatus having obtained the data of FIG. 2 was used.

First, as a first step, the Si substrate 101 was cleaned to remove a native oxide film, and after that, oxidized the surface portion of the Si substrate 101 by using a RTA (Rapid Thermal Annealing) apparatus, thereby to form the $SiO_2$ film 102 of 1.8 nm in thickness.

Next, the Si substrate 101 attached with the $SiO_2$ film 102 was introduced into a plasma treatment chamber, and was disposed on a substrate support stage set at the temperature of 100° C. A vacuum container was introduced with a Ne gas of 100 sccm, and the pressure was adjusted to 10 Pa, and a high frequency power of 3000 W was applied, thereby generating Ne plasma. The surface of the $SiO_2$ film 102 was exposed to this Ne plasma continuously for 10 seconds, whereby the ion irradiation process at the incident energy of 15 eV was performed. Thereby, the surface layer portion (0.8 nm in thickness) of the $SiO_2$ film 102 was made into the reaction-accelerating layer 104.

Next, as a second step, while holding the Si substrate 101 attached with the $SiO_2$ film 102 in vacuum, it was moved to a metal Hf deposition chamber, and the metal Hf film 105 was laminated to the thickness of 0.8 nm in the non-oxidizing atmosphere by the sputtering method. Thereby, the metal Hf was diffused into the reaction-accelerating layer 104 to form the HfSiOx film 106. An oxide partial pressure during the forming process of the metal Hf film 105 was $1\times10^{-7}$ to $10^{-8}$ Pa.

Next, the processes subsequent to the third step were performed similarly to the example 1, thereby to fabricate the sample of the present invention, and its MOS capacitor characteristic was measured.

For comparison, a comparison sample was similarly fabricated except that the ion irradiation process was not performed, and its MOS capacitor characteristic was measured.

As a result, the value of the EOT was approximately 1.5 nm in the sample of the present invention obtained by performing the iron irradiation process, whereas it was approximately 1.7 nm in the comparison sample having not performed the ion irradiation process. As described above, by performing the nitride plasma irradiation before forming the metal Hf film by the sputtering, the EOT was reduced by approximately 0.2 nm, and even in the case of using the Ne plasma in the ion irradiation process, the effectivity of the present invention was confirmed.

Example 4

As a fourth example of the present invention, an example will be shown, in which the surface of the $SiO_2$ film 102 of 1.4 nm in initial film thickness is irradiated with the Ne plasma by an ion irradiation process, thereby making the surface layer portion of the $SiO_2$ film 102 into the reaction-accelerating layer 104. In the present example, in the ion irradiation process, the surface wave interference plasma treatment apparatus which is the apparatus having obtained the data of FIG. 2 was used.

First, as a first step, the Si substrate 101 was cleaned to remove a native oxide film, and after that, oxidized the surface portion of the Si substrate 101 by using a RTA (Rapid Thermal Annealing) apparatus, thereby to form the $SiO_2$ film 102 of 1.4 nm in thickness.

Next, the Si substrate 101 attached with the $SiO_2$ film 102 was introduced into a plasma treatment chamber, and was disposed on a substrate support stage set at the temperature of 100° C. A vacuum container was introduced with a Ne gas of 200 sccm, and the pressure was adjusted to 25 Pa, and a high frequency power of 3000 W was applied, thereby generating Ne plasma. The surface of the $SiO_2$ film 102 was exposed to this Ne plasma continuously for 15 seconds, whereby the ion irradiation process at the incident energy of 15 eV was performed. Thereby, the surface layer portion (0.6 nm in thickness) of the $SiO_2$ film 102 was made into the reaction-accelerating layer 104.

Next, as a second step, while holding the Si substrate 101 attached with the $SiO_2$ film 102 in vacuum, it was moved to a metal Hf deposition chamber, and the metal Hf film 105 was laminated to the thickness of 0.5 nm in the non-oxidizing atmosphere by the sputtering method. Thereby, the metal Hf was diffused into the reaction-accelerating layer 104 to form the HfSiOx film 106. An oxide partial pressure during the forming process of the metal Hf film 105 was $1\times10^{-7}$ to $10^{-8}$ Pa.

Next, the processes subsequent to the third step were performed similarly to the example 1, thereby to fabricate the sample of the present invention, and its MOS capacitor characteristic was measured.

For comparison, a comparison sample was similarly fabricated except that the ion irradiation was not performed, and its MOS capacitor characteristic was measured.

As a result, the value of the EOT was approximately 1.3 nm in the sample of the present invention obtained by performing the ion irradiation process, whereas it was approximately 1.5 nm in the comparison sample having not performed the ion irradiation process. As described above, by performing the nitride plasma irradiation before forming the metal Hf film by the sputtering, the EOT was reduced by approximately 0.2 nm, and even when the Ne plasma was used in the ion irradiation process by the $SiO_2$ film 102 of 1.4 nm in initial film thickness, the effectivity of the present invention was confirmed.

Example 5

As a fifth example of the present invention, an example will be shown, in which the surface of the $SiO_2$ film 102 of 1.8 nm in initial film thickness is irradiated with the Ar plasma by an ion irradiation process, thereby making the surface layer portion of the $SiO_2$ film 102 into the reaction-accelerating layer 104. In the present example, in the ion irradiation process, the surface wave interference plasma treatment apparatus which is the apparatus having obtained the data of FIG. 2 was used.

First, as a first step, the Si substrate 101 was cleaned to remove a native oxide film, and after that, oxidized the surface portion of the Si substrate 101 by using a RTA (Rapid Thermal Annealing) apparatus, thereby to form the $SiO_2$ film 102 of 1.8 nm in thickness.

Next, the Si substrate 101 attached with the $SiO_2$ film 102 was introduced into a plasma treatment chamber, and was disposed on a substrate support stage set at the temperature of 100° C. A vacuum container was introduced with an Ar gas of 100 sccm, and the pressure was adjusted to 10 Pa, and a high frequency power of 3000 W was applied, thereby generating Ar plasma. The surface of the $SiO_2$ film 102 was exposed to this Ar plasma continuously for 20 seconds, whereby the ion irradiation process at the incident energy of 15 eV was performed. Thereby, the surface layer portion (0.7 nm in thickness) of the $SiO_2$ film 102 was made into the reaction-accelerating layer 104.

Next, as a second step, while holding the Si substrate 101 attached with the $SiO_2$ film 102 in vacuum, it was moved to a metal Hf deposition chamber, and the metal Hf film 105 was laminated to the thickness of 0.5 nm in the non-oxidizing atmosphere by the sputtering method. Thereby, the metal Hf was diffused into the reaction-accelerating layer 104 to form the HfSiOx film 106. An oxide partial pressure during the forming process of the metal Hf film 105 was $1\times10^{-7}$ to $10^{-8}$ Pa.

Next, the processes subsequent to the third step were performed similarly to the example 1, thereby to fabricate the sample of the present invention, and its MOS characteristic was measured.

For comparison, a comparison sample was similarly fabricated except that the ion irradiation process was not performed, and its MOS capacitor characteristic was measured.

As a result, the value of the EOT was approximately 1.6 nm in the sample of the present invention obtained by performing the iron irradiation process, whereas it was approximately 1.7 nm in the comparison sample having not performed the ion irradiation process. As described above, by performing the nitride plasma irradiation before forming the metal Hf film by the sputtering, the EOT was reduced by approximately 0.1 nm, and even in the case of using the Ar plasma in the ion irradiation process, the effectivity of the present invention was confirmed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-336730, filed Dec. 27, 2007, which is hereby incorporated by reference herein in its entirety.

What is claimed is:

1. A method of forming a dielectric film including a metal silicate on a silicon substrate, comprising:
   a first step of oxidizing a surface of the silicon substrate for forming a silicon oxide film;
   a second step of irradiating a rare gas ion on the surface of the silicon oxide film for forming the surface of the silicon oxide film which does not contact the silicon substrate into a reaction-accelerating layer with Si—O bonds severed;
   a third step of laminating a metal film on the reaction-accelerating layer in a non-oxidizing atmosphere; and a fourth step of oxidizing the metal film for forming a metal silicate film that diffuses a metal from the metal film to the silicon oxide film.

2. The method of forming a dielectric film according to claim 1, further comprising a fifth step of nitriding the metal silicate film after the fourth step.

3. The method of forming a dielectric film according to claim 2, wherein the nitriding of the fifth step is executed by radical nitriding.

4. The method of forming a dielectric film according to claim 1, wherein the incident energy of the ion is 2 eV or more and 20 eV or less.

5. The method of forming a dielectric film according to claim 1, wherein the third step is executed by sputtering.

6. The method of forming a dielectric film according to claim 1, wherein the reaction-accelerating layer is made into the metal silicate film by the third step.

7. The method of forming a dielectric film according to claim 1, wherein the oxidation of the fourth step is executed by radical oxidation.

8. The method of forming a dielectric film according to claim 1, wherein the surface of the silicon oxide film is formed into the reaction-accelerating layer employing surface wave interference plasma.

9. A method of forming a dielectric film including a metal silicate on a silicon substrate, comprising:
a first step of oxidizing a surface of the silicon substrate for forming a silicon oxide film;
a second step of irradiating an ion selected from the group consisting of a rare gas ion, nitrogen ion, oxygen ion, oxide ion and nitride ion at an incident energy of the ion of 2 eV to 20 eV on the surface of the silicon oxide film for forming the surface of the silicon oxide film which does not contact the silicon substrate into a reaction-accelerating layer with severed Si—O bonds;
a third step of laminating a metal film on the reaction-accelerating layer in a non-oxidizing atmosphere; and
a fourth step of oxidizing the metal film for forming a metal silicate film that diffuses a metal from the metal film to the silicon oxide film.

* * * * *